United States Patent [19]
Wilson et al.

[11] Patent Number: 5,936,426
[45] Date of Patent: Aug. 10, 1999

[54] LOGIC FUNCTION MODULE FOR FIELD PROGRAMMABLE ARRAY

[75] Inventors: Stanley Wilson, Mountain View; King W. Chan, Los Altos; Mark Frappier, San Mateo, all of Calif.

[73] Assignee: Actel Corporation, Sunnyvale, Calif.

[21] Appl. No.: 08/794,096

[22] Filed: Feb. 3, 1997

[51] Int. Cl.$^6$ .............................................. H03K 19/094
[52] U.S. Cl. .......................... 326/49; 326/106; 327/408
[58] Field of Search .................................. 326/49, 39, 40, 326/41, 105, 106, 107, 113; 327/408, 407

[56] References Cited

U.S. PATENT DOCUMENTS

| | | |
|---|---|---|
| 3,106,698 | 10/1963 | Unger . |
| 3,184,603 | 5/1965 | Hellerman . |
| 3,201,574 | 8/1965 | Szekely . |
| 3,287,702 | 11/1966 | Borck, Jr. et al. . |
| 3,287,703 | 11/1966 | Slotnick . |
| 3,381,117 | 4/1968 | Forslund et al. . |
| 3,400,379 | 9/1968 | Harman . |
| 3,423,646 | 1/1969 | Cubert et al. . |
| 3,428,903 | 2/1969 | Forslund et al. . |

(List continued on next page.)

FOREIGN PATENT DOCUMENTS

| | | |
|---|---|---|
| 0 031 431 | 7/1981 | European Pat. Off. . |
| 0 081 917 | 6/1983 | European Pat. Off. . |
| 0 094 234 | 11/1983 | European Pat. Off. . |
| 0 176 938 | 4/1986 | European Pat. Off. . |
| 1-093918 | 4/1989 | European Pat. Off. . |

(List continued on next page.)

OTHER PUBLICATIONS

Won et al., "Building FIR Filters in Programmable Logic", Aug. 1996, Embedded Systems Programming, pp. 48–50, 52, 54, 56, 58–59.

Actel Corporation, "A10M20A Mask Programmed Gate Array", Jan., 1992, pp. 1–195–1–224.

Actel Corporation, "Array Architecture for ATG with 100% Fault Coverage", Jan., 1992, pp. 1–225–1–235.

Actel Corporation, "ACT 1 FPGAs ACT 1010 and ACT 1020", 1990, pp. 1–25.

Carmel, U.S. Patent Application SN 06/754,653, now abandoned, filed Jul. 15, 1985.

Chen, "A Comparison of Universal–Logic–Module Realizations and Their Application in the Synthesis of Combinatorial and Sequential Logic Networks", Feb. 1982, IEEE Transactions on Computers, vol. C–31, No. 2, pp. 140–147.

Chen, International Journal of Electronics, 1981, vol. 50, No. 1, pp. 1–13.

(List continued on next page.)

*Primary Examiner*—Jon Santamauro
*Assistant Examiner*—Don Phu Le
*Attorney, Agent, or Firm*—D'Alessandro & Ritchie

[57] ABSTRACT

A logic function module comprises a plurality of input nodes and an output node. A first control circuit has at least one input connected to one of the input nodes, a first output, and a second output which is the complement of the first output. A second control circuit has at least one input connected to one of the input nodes, a first output, and a second output which is the complement of the first output. A first switching circuit is connected between one of the input nodes and the output node and is controlled from the first output of the first control circuit the first output of the second switching circuit. A second switching circuit is connected between one of the input nodes and the output node and is controlled from the second output of the first control circuit the first output of the second switching circuit. A third switching circuit is connected between one of the input nodes and the output node and is controlled from the first output of the first control circuit the second output of the second switching circuit. A fourth switching circuit is connected between one of the input nodes and the output node and is controlled from the second output of the first control circuit the second output of the second switching circuit.

17 Claims, 5 Drawing Sheets

U.S. PATENT DOCUMENTS

| | | |
|---|---|---|
| 3,439,185 | 4/1969 | Gibson . |
| 3,473,160 | 10/1969 | Wahlstrom . |
| 3,564,514 | 2/1971 | Gunderson . |
| 3,576,984 | 5/1971 | Gregg, Jr. . |
| 3,619,583 | 11/1971 | Arnold . |
| 3,731,073 | 5/1973 | Moylan . |
| 3,750,115 | 7/1973 | Mundy . |
| 3,806,891 | 4/1974 | Eichelberger et al. . |
| 3,816,725 | 6/1974 | Greer . |
| 3,818,252 | 6/1974 | Chiba et al. . |
| 3,818,452 | 6/1974 | Greer . |
| 3,838,296 | 9/1974 | McLeod . |
| 3,849,638 | 11/1974 | Greer . |
| 3,902,050 | 8/1975 | Schmidt et al. . |
| 3,912,914 | 10/1975 | Moylan . |
| 4,032,894 | 6/1977 | Williams . |
| 4,091,359 | 5/1978 | Rossler . |
| 4,140,924 | 2/1979 | Ogney et al. . |
| 4,153,938 | 5/1979 | Ghest et al. . |
| 4,157,480 | 6/1979 | Edwards . |
| 4,157,589 | 6/1979 | Kapral et al. . |
| 4,195,352 | 3/1980 | Tu et al. . |
| 4,240,094 | 12/1980 | Mader . |
| 4,293,783 | 10/1981 | Patil . |
| 4,354,228 | 10/1982 | Moore et al. . |
| 4,354,266 | 10/1982 | Cooperman et al. . |
| 4,357,678 | 11/1982 | Davis . |
| 4,409,499 | 10/1983 | Zapisek et al. . |
| 4,414,547 | 11/1983 | Knapp et al. . |
| 4,424,456 | 1/1984 | Shiraki . |
| 4,453,096 | 6/1984 | Le Can et al. . |
| 4,491,839 | 1/1985 | Adam . |
| 4,513,307 | 4/1985 | Brown . |
| 4,541,067 | 9/1985 | Whitaker . |
| 4,542,508 | 9/1985 | Moore ........................................ 371/29 |
| 4,546,455 | 10/1985 | Iwahashi et al. . |
| 4,551,634 | 11/1985 | Takahashi et al. . |
| 4,558,236 | 12/1985 | Burrows . |
| 4,577,124 | 3/1986 | Koike . |
| 4,600,846 | 7/1986 | Burrows . |
| 4,609,986 | 9/1986 | Hartmann et al. . |
| 4,616,358 | 10/1986 | Rehm et al. . |
| 4,617,479 | 10/1986 | Hartmann et al. . |
| 4,620,117 | 10/1986 | Fang . |
| 4,639,896 | 1/1987 | Brannigan et al. . |
| 4,644,191 | 2/1987 | Fisher et al. . |
| 4,654,548 | 3/1987 | Tanizawa et al. . |
| 4,670,748 | 6/1987 | Williams . |
| 4,677,318 | 6/1987 | Veenstra . |
| 4,684,829 | 8/1987 | Uratani . |
| 4,684,830 | 8/1987 | Tsui et al. . |
| 4,701,922 | 10/1987 | Kuboki et al. . |
| 4,703,206 | 10/1987 | Cavlan . |
| 4,703,436 | 10/1987 | Varshney . |
| 4,706,216 | 11/1987 | Carter . |
| 4,706,217 | 11/1987 | Shimizu et al. . |
| 4,710,649 | 12/1987 | Lewis . |
| 4,713,792 | 12/1987 | Hartmann et al. . |
| 4,717,912 | 1/1988 | Harvey et al. . |
| 4,727,268 | 2/1988 | Hori . |
| 4,754,456 | 6/1988 | Yato et al. . |
| 4,758,746 | 7/1988 | Birkner et al. . |
| 4,758,985 | 7/1988 | Carter . |
| 4,761,768 | 8/1988 | Turner et al. . |
| 4,763,020 | 8/1988 | Takata et al. . |
| 4,764,893 | 8/1988 | Karabatsos . |
| 4,764,926 | 8/1988 | Knight et al. . |
| 4,771,285 | 9/1988 | Agrawal et al. . |
| 4,772,811 | 9/1988 | Fujioka et al. . |
| 4,774,421 | 9/1988 | Hartmann et al. . |
| 4,786,904 | 11/1988 | Graham, III et al. . |
| 4,787,064 | 11/1988 | Wagner . |
| 4,789,951 | 12/1988 | Birkner et al. . |
| 4,821,176 | 4/1989 | Ward et al. . |
| 4,825,105 | 4/1989 | Hölzle . |
| 4,847,612 | 7/1989 | Kaplinsky . |
| 4,852,021 | 7/1989 | Inoue et al. . |
| 4,855,616 | 8/1989 | Wang et al. . |
| 4,870,302 | 9/1989 | Freeman . |
| 4,871,930 | 10/1989 | Wong et al. . |
| 4,885,719 | 12/1989 | Brahmbhatt . |
| 4,910,417 | 3/1990 | El Gamal et al. . |
| 4,912,342 | 3/1990 | Wong et al. . |
| 4,912,677 | 3/1990 | Itano et al. . |
| 4,924,287 | 5/1990 | Orbach . |
| 4,933,577 | 6/1990 | Wong et al. . |
| 4,963,768 | 10/1990 | Agrawal et al. . |
| 4,963,770 | 10/1990 | Keida . |
| 4,983,959 | 1/1991 | Breuninger . |
| 4,992,680 | 2/1991 | Benedetti et al. . |
| 5,001,368 | 3/1991 | Cliff et al. . |
| 5,012,135 | 4/1991 | Kaplinsky . |
| 5,019,736 | 5/1991 | Furtek . |
| 5,045,726 | 9/1991 | Leung . |
| 5,046,035 | 9/1991 | Jigour et al. . |
| 5,055,718 | 10/1991 | Galbraith et al. . |
| 5,075,576 | 12/1991 | Cavlan . |
| 5,121,006 | 6/1992 | Pedersen . |
| 5,122,685 | 6/1992 | Chan et al. . |
| 5,144,166 | 9/1992 | Camarota et al. . |
| 5,151,623 | 9/1992 | Agrawal . |
| 5,153,462 | 10/1992 | Agrawal et al. . |
| 5,172,014 | 12/1992 | El Ayat et al. . |
| 5,185,706 | 2/1993 | Agrawal et al. . |
| 5,187,393 | 2/1993 | El Gamal et al. . |
| 5,208,491 | 5/1993 | Ebeling et al. . |
| 5,220,213 | 6/1993 | Chan et al. . |
| 5,220,214 | 6/1993 | Pedersen . |
| 5,223,792 | 6/1993 | El-Ayat et al. . |
| 5,225,719 | 7/1993 | Agrawal et al. . |
| 5,231,588 | 7/1993 | Agrawal et al. . |
| 5,245,227 | 9/1993 | Furtek et al. . |
| 5,280,202 | 1/1994 | Chan et al. . |
| 5,313,119 | 5/1994 | Cooke et al. . |
| 5,319,254 | 6/1994 | Goetting . |
| 5,329,181 | 7/1994 | Ridgeway . |
| 5,331,226 | 7/1994 | Goetting . |
| 5,338,982 | 8/1994 | Kawana . |
| 5,338,983 | 8/1994 | Agarwala . |
| 5,341,044 | 8/1994 | Ahanin et al. . |
| 5,350,954 | 9/1994 | Patel . |
| 5,352,940 | 10/1994 | Watson . |
| 5,359,242 | 10/1994 | Veenstra . |
| 5,365,125 | 11/1994 | Goetting et al. . |
| 5,367,208 | 11/1994 | El Gamal et al. . |
| 5,371,422 | 12/1994 | Patel et al. . |
| 5,386,154 | 1/1995 | Goetting et al. . |
| 5,396,127 | 3/1995 | Chan et al. . |
| 5,399,922 | 3/1995 | Kiani et al. ............................. 326/40 |
| 5,414,377 | 5/1995 | Freidin . |
| 5,416,367 | 5/1995 | Chan et al. ............................. 326/44 |
| 5,418,480 | 5/1995 | Hastie et al. ............................ 326/113 |
| 5,430,390 | 7/1995 | Chan et al. ............................. 326/38 |
| 5,436,574 | 7/1995 | Veenstra . |
| 5,440,245 | 8/1995 | Galbraith et al. ....................... 326/38 |
| 5,442,246 | 8/1995 | Azegami et al. ........................ 326/38 |
| 5,448,185 | 9/1995 | Kaptanoglu ............................. 326/39 |
| 5,451,887 | 9/1995 | El-Ayat et al. .......................... 326/39 |
| 5,457,410 | 10/1995 | Ting . |
| 5,463,327 | 10/1995 | Hastie ..................................... 326/37 |
| 5,465,055 | 11/1995 | Ahrens .................................... 326/41 |
| 5,477,165 | 12/1995 | El-Ayat et al. .......................... 326/38 |

| | | |
|---|---|---|
| 5,483,178 | 1/1996 | Costello et al. .................... 326/41 |
| 5,488,315 | 1/1996 | Mahant-Shetti et al. ................. 326/37 |
| 5,489,857 | 2/1996 | Agrawal et al. .................... 326/41 |
| 5,499,192 | 3/1996 | Knapp et al. . |
| 5,500,608 | 3/1996 | Goetting et al. .................... 326/39 |
| 5,508,637 | 4/1996 | Mehendale .................... 326/38 |
| 5,523,706 | 6/1996 | Kiani et al. . |
| 5,550,771 | 8/1996 | Hatori .................... 365/174 |
| 5,550,782 | 8/1996 | Cliff et al. .................... 365/230.03 |
| 5,565,792 | 10/1996 | Chiang et al. .................... 326/40 |
| 5,570,041 | 10/1996 | El-Ayat et al. .................... 326/41 |
| 5,574,678 | 11/1996 | Gorecki . |
| 5,587,669 | 12/1996 | Chan et al. .................... 326/38 |
| 5,594,363 | 1/1997 | Freeman et al. .................... 326/39 |
| 5,594,364 | 1/1997 | Chan et al. .................... 326/39 |
| 5,596,287 | 1/1997 | Cho .................... 326/40 |
| 5,606,267 | 2/1997 | El Ayat et al. .................... 326/41 |
| 5,610,534 | 3/1997 | Galbraith et al. . |
| 5,610,536 | 3/1997 | Diba et al. . |
| 5,612,631 | 3/1997 | Agrawal et al. . |
| 5,629,636 | 5/1997 | Ahrens . |
| 5,633,601 | 5/1997 | Nagaraj . |
| 5,646,546 | 7/1997 | Bertolet et al. . |
| 5,646,547 | 7/1997 | Goetting . |
| 5,682,106 | 10/1997 | Cox et al. . |
| 5,682,107 | 10/1997 | Tavana et al. . |
| 5,694,058 | 12/1997 | Reddy et al. .................... 326/41 |

FOREIGN PATENT DOCUMENTS

| | | |
|---|---|---|
| 0 177 261 | 11/1990 | European Pat. Off. . |
| 0 415 542 | 3/1991 | European Pat. Off. . |
| 0 583 872 | 2/1994 | European Pat. Off. . |
| 0 584 910 | 3/1994 | European Pat. Off. . |
| 0 584 911 | 3/1994 | European Pat. Off. . |
| 0 585 119 | 3/1994 | European Pat. Off. . |
| 0 690 579 | 1/1996 | European Pat. Off. . |
| 0 746 107 | 12/1996 | European Pat. Off. . |
| 0 748 050 | 12/1996 | European Pat. Off. . |
| 0 806 836 A2 | 11/1997 | European Pat. Off. ...... H03K 19/177 |
| 2-75218 | 3/1990 | Japan . |
| 8-051355 | 2/1996 | Japan . |
| 1 101 851 | 1/1968 | United Kingdom . |
| 2 045 488 | 10/1980 | United Kingdom . |
| 2 138 188 | 10/1984 | United Kingdom . |
| 2 171 231 | 8/1986 | United Kingdom . |
| 91/07015 | 5/1991 | WIPO . |
| WO 95/16993 | 6/1995 | WIPO .................... G11C 11/40 |
| WO 96/20534 | 7/1996 | WIPO .................... H03K 19/173 |
| WO 96/31950 | 10/1996 | WIPO .................... H03K 7/38 |

OTHER PUBLICATIONS

El-Ayat, "A CMOS Electrically Configurable Gate Array", Jun., 1989, IEEE Journal of Solid–State Circuits, vol. 24, No. 3, pp. 752–761.

Fujiwara, "Universal Test Sets for Programmable Logic Arrays", 1980, IEEE, International Symposium on Fault Tolerant Computing, pp. 137–142.

Greer, "An Associative Logic Matrix", Oct. 1976, IEEE, Journal of Solid–State Circuits, vol. SC–11, No. 5, pp. 679–691.

Haines, "Field–Programmable Gate Array with Non–Volatile Configuration", Jun. 1989, Microprocessors and Microsystems, vol. 13, No. 5, pp. 305–312.

Hayes, "A Unified Switching Theory with Applications to VLSI Design", 1982, IEEE, vol. 70, No. 10, pp. 1140–1151.

Hellerman, "A Catalog of Three–Variable Or–Invert and And–Invert Logical Circuits", IEEE Transactions on Electronic Computers, pp. 198–216.

Hong, "FITPLA: A Programmable Logic Array for Function Independent Testing", 1980, IEEE, International Symposium on Fault Tolerant Computing, pp. 131–136.

I.B.M. Technical Disclosure Bulletin, Jul., 1985, vol. 28. No. 2.

Ishizuka, "Synthesis of a Pas Transistor Network Applied to Multi–Valued Logic", 1986, IEEE 16th International Symposium on Multiple–Valued Logic, pp. 51–57.

Kautz, "Cellular Logic–in–Memory Arrays", Aug. 1969, IEEE Transactions on Computers, vol. C–18, No. 8, pp. 719–727.

Lofti, "Utilisation de multiplexeurs pour la realisation de fonctions logiques", L'Onde Electrique, 1979, vol. 59, No. 11, pp. 83–86.

LSI, Databook and Design Manual, HCMOS, Oct. 1986.

Miller, "System Design Considerations Using Field Programmable Gate Arrays", Nov. 1991, Wescon Conf. Record, pp. 46–54.

Monolithic Memories, "Bipolar LSI Data Book", 1978, First Edition.

Motorola, CMOS Logic Data, Series B, 1988.

Murugesan, "Programmable Universal Logic Module", 1976, International Journal of Electronics, vol. 40, No. 5, pp. 509–512.

National Semiconductor, "Programmable Logic Devices Databook and Design Guide", 1990.

Patil, "A Programmable Logic Approach to VLSI", 1979, IEEE Transactions on Computers, vol. C–28, No. 9, pp. 594–601.

Popovici, "Bistabile Kippstufen aus Universalen Logikschaltungen", 1972, Elektronik, Heft 9, pp. 229–302.

Rose, "The Effect of Logic Block Complexity on Area of Programmable Gate Arrays", 1989, IEEE Custom Integrated Circuits Conference, pp. 531–535.

Rotolo, "Technique simplifies multiple–input exclusive–OR gates", May, 1978, 2119 EDN, vol. 23, No. 10.

Schuster, "Keine Angst vor FPGAs", 1993, 2087 Elektronik, 42, No. 11, Munchen, DE.

Sklansky, "Conditional–Sum Addition Logic", 1959, IRE Transactions on Electronic Computers, pp. 226–231.

Smith, "Intel's FLEXlogic FPGA Architecture", 1993, IEEE, pp. 378–384.

Srivastava, "Microelectronics and Reliability", 1984, vol. 24, No. 5, pp. 885–896.

Texas Instruments, "The TTL Data Book", Second Edition, 1981, pp. 7–181–7–182, 7–250 & 7–270.

Texas Instruments, "High Speed CMOS Logic, Data Book", 1988, pp. 2–337–2–338, 2–93.

Wahlstrom, "An 11000–Fuse Electrically Erasable Programmable Logic Device (EEPLD) with an Extended Macrocell", Aug. 1988, IEEE Journal of Solid–State Circuits, vol. 23, No. 4, pp. 916–921.

Wong, "A 5000–Gate CMOS EPLD With Multiple Logic and Interconnect Arrays", IEEE Custom Integrated Circuits Conference, pp. 5.8.1–5.8.4.

Wood, "A High Density Programmable Logic Array Chip", 1979, IEEE Transactions on Computers, vol. C–28, No. 9, pp. 602–608.

Yau, "Universal Logic Modules and Their Applications", 1970, IEEE Transactions on Computers, vol. C–19, No. 2, pp. 141–149.

LOGIC FUNCTION MODULE FOR FIELD PROGRAMMABLE ARRAY

BACKGROUND OF THE INVENTION

1. Field of the Invention

The present invention relates to field programmable gate arrays and similar circuits, and to logic function modules for use therein. More particularly, the present invention relates to logic function modules and interconnect structures for use in field programmable gate arrays and other similar circuit applications.

2. The Prior Art

Programmable logic blocks which are capable of performing a selectable one of a plurality of user-selectable logic functions are known in the prior art. U.S. Pat. No. 4,910,417 to El Gamal et al., assigned to the same assignee as the present invention, U.S. Pat. No. 5,055,718 to Galbraith et al., assigned to the same assignee as the present invention and U.S. Pat. No. 4,453,096 to Le Can et al., disclose logic modules composed of multiplexers capable of performing a plurality of combinatorial logic functions.

Later multiplexer based logic function modules are disclosed in U.S. Pat. No. 5,396,127 to Chan et al. The multiplexer based logic function modules disclosed in Chan et al. provide additional features such as multiterm gating on the inputs of the multiplexers and sequential elements cascaded after the multiplexers.

While these logic function circuits provide a degree of flexibility to the designer of user-programmable logic arrays, there is always a need for improvement of functionality and performance of such circuits.

BRIEF DESCRIPTION OF THE INVENTION

A logic function module according to the present invention comprises first through eighth input nodes and an output node. While the first through fourth input nodes are referred to herein as control nodes and the fifth through eighth input nodes are referred to herein as data nodes for purposes of conceptually understanding the present invention, persons of ordinary skill in the art will observe that such labelling is not determinative or limiting in the use of the circuits disclosed herein.

A first logic gate has a first input driven from the first input node, a second input driven from the second input node, and an output. A first inverter has an input driven from the output of the first logic gate and an output. A second logic gate has a first input driven from the third input node, a second input driven from the fourth input node, and an output. A second inverter has an input driven from the output of the second logic gate and an output. The outputs of the first and second logic gates and the first and second inverters are used to provide gating signals for switching transistors in the logic function module.

First and second MOS transistors have their channels connected in series between the fifth input node and the output node. The gate of the first MOS transistor is driven from the output of the first logic gate and the gate of the second MOS transistor is driven from the output of the second logic gate.

Third and fourth MOS transistors have their channels connected in series between the sixth input node and the output node. The gate of the third MOS transistor is driven from the output of the second logic gate and the gate of the fourth MOS transistor is driven from the output of the first inverter.

Fifth and sixth MOS transistors have their channels connected in series between the seventh input node and the output node. The gate of the fifth MOS transistor is driven from the output of the first logic gate and the gate of the sixth MOS transistor is driven from the output of the second inverter.

Seventh and eighth MOS transistors have their channels connected in series between the eighth input node and the output node. The gate of the seventh MOS transistor is driven from the output of the first inverter and the gate of the eighth MOS transistor is driven from the output of the second inverter.

A buffer may be driven from the output node to provide a desired drive level to the logic function module of the present invention. As will be appreciated by persons of ordinary skill in the art, such a buffer may be inverting or non-inverting. Buffers or input gates may be added to the data inputs to the cells.

Ninth and tenth MOS transistors may optionally be provided having their channels connected in series shunting the seventh and eighth MOS transistors between the eighth input node and the output node. The gate of the ninth MOS transistor is driven from the output of the second inverter and the gate of the tenth MOS transistor is driven from the output of the first inverter.

A CMOS implementation of the logic function module of the present invention employs N-Channel and P-Channel transistor pairs as switches in place of the single MOS transistor switches.

BRIEF DESCRIPTION OF THE DRAWING FIGURES

FIG. 1b is a block diagram of the prior-art multiplexer-implemented logic function module of FIG. 1a.

FIG. 2c is a schematic diagram of a CMOS implementation of the logic function module of FIG. 2a.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The phrase "driven from" as used herein is intended to denote the source of signals for the inputs of various elements in the logic function module of the present invention. Although the disclosed embodiment shows direct connections between driving outputs and driven inputs, this term is intended to be broad enough to cover more than a mere direct connection between the elements and can imply other circuit elements interposed in between the driving output and the driven input.

Figure 1A:
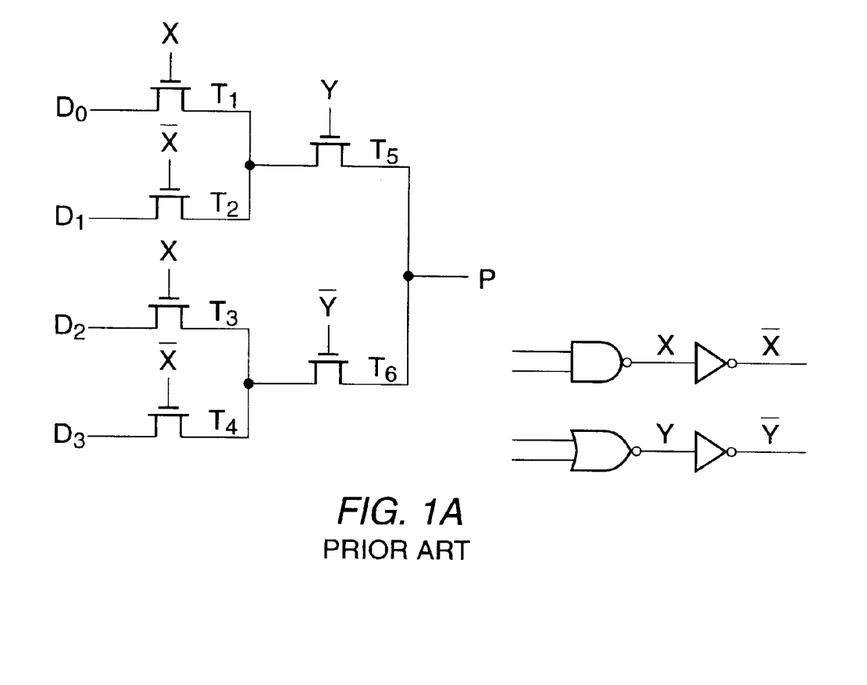
FIG. 1a is a schematic diagram of a typical prior-art multiplexer-implemented logic function module.
Figure 1B:
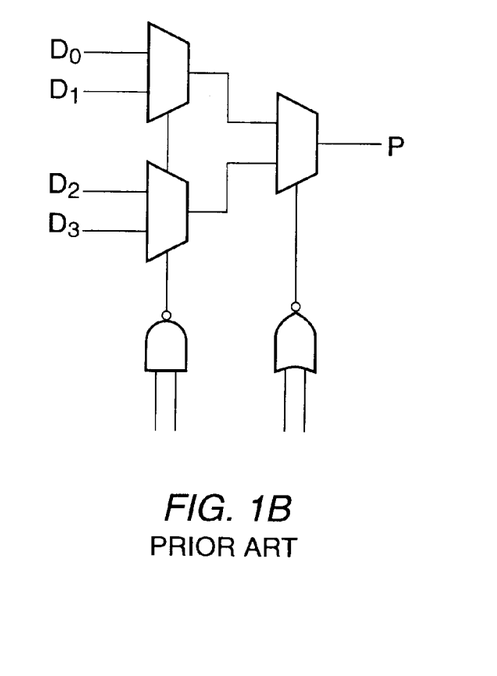

Referring first to FIGS. 1a and 1b, schematic and block diagrams, respectively, of a typical prior-art multiplexer-implemented logic function module is presented. An understanding of the way in which the logic function module of FIGS. 1a and 1b function will facilitate an understanding of the advantages which can be obtained by employing the logic function module of the present invention. These advantages will become apparent from the disclosure of the preferred embodiment herein.

The prior art multiplexer-based logic function module of FIGS. 1a and 1b employs two 2:1 multiplexers cascaded with a third 2:1 multiplexer. Referring first to FIG. 1a, transistors T1 and T2 form the first 2:1 multiplexer and pass the input at either D0 or D1 to the common output connection of T1 and T2 in accordance with which ever one of their gates turns on the channel. Similarly, transistors T3 and T4 form the second 2:1 multiplexer and pass the input at either D2 or D3 to the common output connection of T3 and T4 in accordance with which ever one of their gates turns on the channel.

A third 2:1 multiplexer comprises transistors T5 and T6. The common output connection of the first multiplexer is connected to the input side of T5 and the common output connection of the second multiplexer is connected to the input side of T6. Output P is the common connection of T5 and T6.

A first gate (the NAND gate) with a cascaded inverter generates signals X and X! to drive the gates of transistors T1 through T4 to perform the select function for the first and second multiplexers. A second gate (the NOR gate) with a cascaded inverter generates signals Y and Y! to drive the gates of transistors T5 and T6 to perform the select function for the third multiplexers.

Referring now to FIG. 1b, the logic function module of FIG. 1a is redrawn in block diagram form. The form of FIG. 1b is the more familiar representation of this circuit used in the art.

Some logic functions that the logic function module of FIGS. 1a and 1b perform are accomplished by fixing the output of the NAND or the NOR gate to a zero or a one and using the other gate to perform the logic function. The logic function module of FIGS. 1a and 1b has a worst-case delay from input node to output node through four devices; the NAND gate, the inverter, transistor T2 or T4, and transistor T5 or T6. If the output of the NOR gate is fixed, then the worst-case delay from input node to output node is four devices; the NAND gate, the inverter, transistor T2 or T4, and transistor T5 or T6. If the output of the NAND gate is fixed, then the worst-case delay from input node to output node is only three devices; the NOR gate, the inverter, and transistor T6. As a result, logic functions that are implemented by fixing the output of the NAND gate are faster than logic functions that are implemented by fixing the output of the NOR gate or not fixing the output of either gate.

Figure 2A:
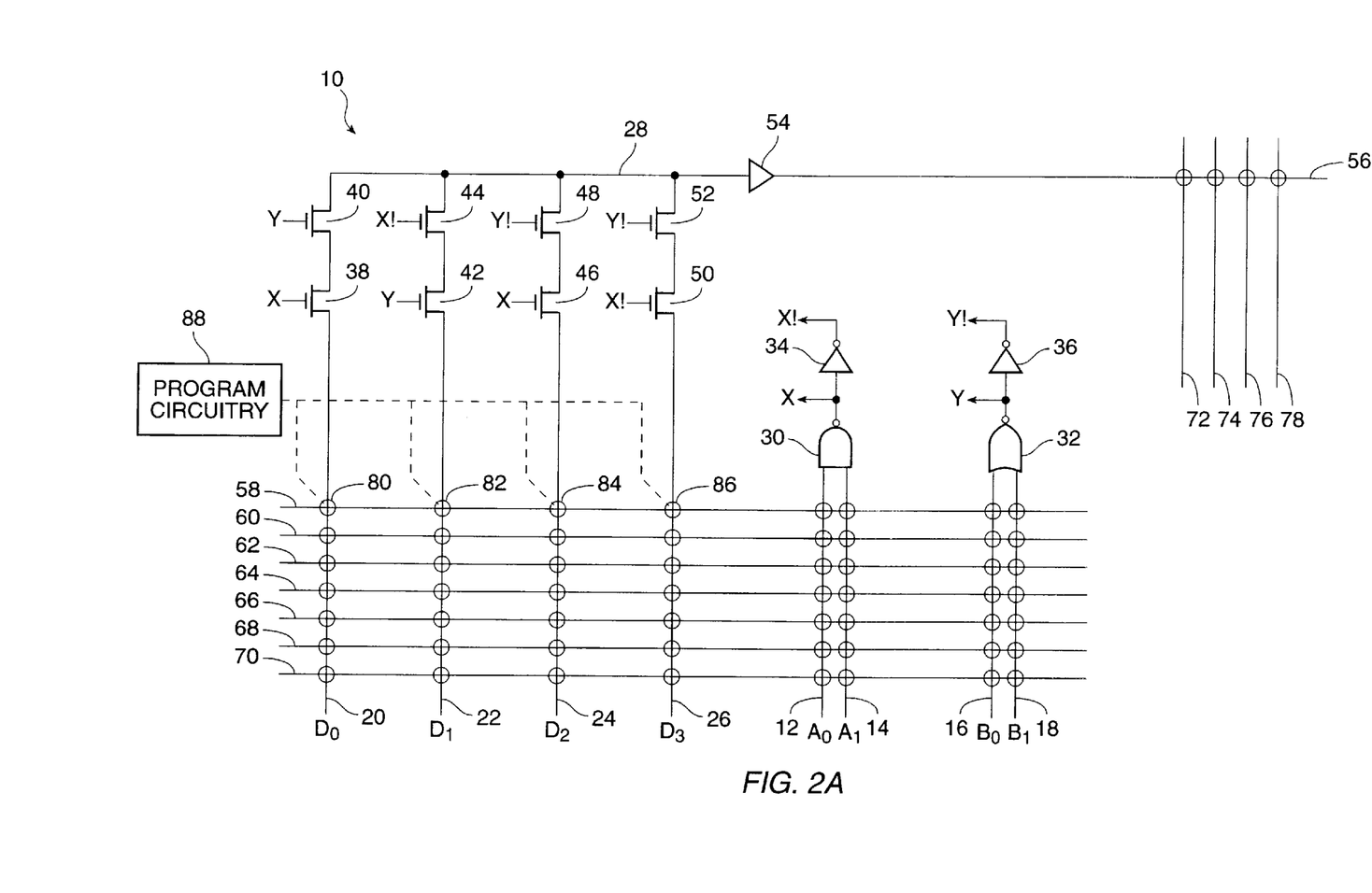
FIG. 2a is a schematic diagram of a presently preferred embodiment of a logic function module according to the present invention.

Referring now to FIG. 2a, a schematic diagram of a logic function module according to a presently preferred embodiment of the invention is shown. Logic function module 10 includes input nodes 12, 14, 16, 18, 20, 22, 24, and 26, and output node 28.

Input nodes 12, 14 are used to drive the inputs of a first gate 30. First gate 30 is shown as a 2-input NAND gate, but those of ordinary skill in the art will appreciate that other gates may be employed. Input nodes 16, and 18 are used to drive the inputs of a second gate 32. Second gate 32 is shown as a 2-input NOR gate, but, as with first gate 30, those of ordinary skill in the art will appreciate that other gates may be employed as second gate 32.

First and second gates 30 and 32 are used to generate gating signals for switching transistors employed in the logic function module of the present invention. To that end, the outputs of first and second gates 30 and 32 are inverted by inverters 34 and 36, respectively, to provide inverted output signals.

As shown in FIG. 2a, the gating signal X is generated by first gate 30 and its complement X! is generated by inverter 34 driven by first gate 30. Similarly, the gating signal Y is generated by second gate 32 and its complement Y! is generated by inverter 36 driven by second gate 32.

The gating signals X, X!, Y, and Y! are used to control switches connected between the input nodes 20, 22, 24, and 26 (labeled logically D0, D1, D2, and D3, respectively) and the output node 28. According to a presently preferred embodiment of the invention, the switches comprise N-Channel MOS transistors.

A first MOS transistor pair comprises N-Channel MOS transistors 38 and 40 connected with their channels in series between input node 20 and output node 28. The gate of N-Channel MOS transistor 38 is driven by the X gating signal from the output of first gate 30. The gate of N-Channel MOS transistor 40 is driven by the Y gating signal from the output of second gate 32.

A second MOS transistor pair comprises N-Channel MOS transistors 42 and 44 connected with their channels in series between input node 22 and output node 28. The gate of N-Channel MOS transistor 42 is driven by the Y gating signal from the output of first gate 32. The gate of N-Channel MOS transistor 44 is driven by the X! gating signal from the output of inverter 34.

A third MOS transistor pair comprises N-Channel MOS transistors 46 and 48 connected with their channels in series between input node 24 and output node 28. The gate of N-Channel MOS transistor 46 is driven by the X gating signal from the output of first gate 30. The gate of N-Channel MOS transistor 48 is driven by the Y! gating signal from the output of inverter 36.

A fourth MOS transistor pair comprises N-Channel MOS transistors 50 and 52 connected with their channels in series between input node 26 and output node 28. The gate of N-Channel MOS transistor 50 is driven by the X! gating signal from the output of inverter 34. The gate of N-Channel MOS transistor 52 is driven by the Y! gating signal from the output of inverter 36.

Since the circuit path between input nodes 20, 22, 24, and 26 and output node 28 comprise pass transistors, output node 28 does not have any inherent drive capability. Accordingly, buffer amplifier 54 may be placed in the circuit between output node 28 and an output conductor 56 used to transport output signals out of logic function module 10. In fact, buffer amplifier 54 will probably be employed in most practical circuit designs using the concepts of the present invention. While buffer amplifier 54 is depicted as a non-inverting buffer, those of ordinary skill in the art will readily recognize that an inverter or any other logic element could be employed as an output buffer as well without departing from the concepts of the present invention. Those of ordinary skill in the art will recognize that input buffers or gates may be provided to drive inputs D0 through D3.

As will be appreciated by those of ordinary skill in the art, the logic function module of the present invention may be employed in a programmable circuit environment in which the input nodes 12, 14, 16, 18, 20, 22, 24, and 26 and the output node 28 are programmably connected to other circuit elements using one of the various known programmable interconnect technologies. Such technologies include, but are not limited to, mask-level programming, laser programming, antifuses, pass transistors, non-volatile memory elements, and the like.

The programmable connectability of the logic function module 10 of the present invention is also illustrated in FIG. 2a. A plurality of interconnect conductors 58, 60, 62, 64, 66, 68, and 70 are shown intersecting the conductors which comprise input nodes 12, 14, 16, 18, 20, 22, 24, and 26. In addition, interconnect conductors 72, 74, 76, and 78 are shown intersecting output conductor 56 of logic function module 10.

Persons of ordinary skill in the art will recognize that interconnect conductors 58, 60, 62, 64, 66, 68, 70, and 72, 74, 76, and 78 are shown all the same length as a matter of drafting convenience. Such skilled persons will appreciate that such interconnect conductors may have varying lengths and/or be segmented depending on the needs of the particular circuit design in which the present invention is implemented.

The intersections between the interconnect conductors 58, 60, 62, 64, 66, 68, and 70 and the input node conductors 12, 14, 16, 18, 20, 22, 24, and 26 are shown populated with programmable interconnect elements (shown as circles, four of which are identified by respective reference numerals 80, 82, 84, and 86). As will be appreciated by those of ordinary skill in the art, programmable interconnect element 80 may take varying forms. Such skilled persons in the art will also recognize that the intersections need not be fully populated with programmable interconnect elements and that interconnect schemes which populate less than 100% of the intersections with programmable interconnect elements are contemplated to be within the scope of the present invention.

One class of such interconnect elements comprises techniques such as laser programming and mask programming. When such interconnect elements are employed, the device containing the logic function module of the present invention is not user programmable but must be programmed during fabrication or after fabrication but prior to packaging.

The other class of programmable interconnect elements are user programmable and comprise known devices such as antifuses, pass transistors, memory cells, or the like. Employing such user programmable interconnect elements enables programming of the device by an user just prior to use of the device containing the logic function module of the present invention.

Although programming circuitry 88 is shown illustratively coupled only to programmable interconnect elements 80, 82, 84, and 86 to avoid unnecessarily overcomplicating the drawing figure, persons of ordinary skill in the art will recognize that programming circuitry 88 will communicate with all programmable interconnect elements in a device. Numerous embodiments of programming circuitry are known in the art, and programming circuitry 88 will vary in accordance with the type of programmable interconnect element employed in any particular circuit fabricated according to the teachings of the present invention.

The logic function module 10 of the present invention implements combinatorial functions including AND, OR, NAND, NOR, and XOR as shown in Table 1. These functions are the same as those which may be performed by the prior art multiplexer-based logic function module of FIGS. 1a and 1b.

Because the logic function module of the present invention performs the same functions as the prior-art logic function modules, it may be advantageously employed to replace such prior-art logic function modules without the need to extensively re-engineer configuration software used to program devices containing them.

TABLE 1

| FUNCTION | A0 | A1 | B0 | B1 | D0 | D1 | D2 | D3 |
|---|---|---|---|---|---|---|---|---|
| NAND = !(A · B) | A | B | 1 | X | X | X | 1 | 0 |
| | A | B | X | 1 | X | X | 1 | 0 |
| | A | B | 0 | 0 | 1 | 0 | X | X |
| | A | B | 0 | 0 | 1 | 0 | 0 | 0 |
| | 1 | A | 0 | B | 1 | 1 | 1 | 0 |
| | 1 | A | B | 0 | 1 | 1 | 1 | 0 |
| | A | 1 | 0 | B | 1 | 1 | 1 | 0 |
| | A | 1 | B | 0 | 1 | 1 | 1 | 0 |
| NOR = !(A + B) | 1 | 1 | A | B | X | 1 | X | 0 |
| | 0 | X | A | B | X | X | 0 | X |
| | X | 0 | A | B | X | X | 0 | X |
| | 1 | A | 0 | B | 1 | 0 | 0 | 0 |
| | 1 | A | B | 0 | 1 | 0 | 0 | 0 |
| | A | 1 | 0 | B | 1 | 0 | 0 | 0 |
| | A | 1 | B | 0 | 1 | 0 | 0 | 0 |
| AND = (A · B) | A | B | 0 | 0 | 0 | 1 | X | X |
| | A | B | 1 | X | X | X | 0 | 1 |
| | A | B | X | 1 | X | X | 0 | 1 |
| | A | B | 0 | 0 | 0 | 0 | 1 | 0 |
| | 1 | A | B | 0 | 0 | 0 | 0 | 1 |
| | 1 | A | 0 | B | 0 | 0 | 0 | 0 |
| | A | 1 | B | 0 | 0 | 0 | 0 | 1 |
| | A | 1 | 0 | B | 0 | 0 | 0 | 1 |
| OR = (A + B) | X | X | A | B | 0 | 0 | 1 | 1 |
| | 0 | X | A | B | 0 | X | 1 | X |
| | X | 0 | A | B | 0 | X | 1 | X |
| | 1 | A | 0 | B | 0 | 1 | 1 | 1 |
| | 1 | A | B | 0 | 0 | 1 | 1 | 1 |
| | A | 1 | 0 | B | 0 | 1 | 1 | 1 |
| | A | 1 | B | 0 | 0 | 1 | 1 | 1 |
| XOR = (A · !B) + (!A · B) | A | 1 | B | 0 | 0 | 1 | 1 | 0 |
| | A | 1 | 0 | B | 0 | 1 | 1 | 0 |
| | 1 | A | B | 0 | 0 | 1 | 1 | 0 |
| | 1 | A | 0 | B | 0 | 1 | 1 | 0 |
| XNOR = (A · B) + (!A · !B) | A | 1 | B | 0 | 1 | 0 | 0 | 1 |
| | A | 1 | 0 | B | 1 | 0 | 0 | 1 |
| | 1 | A | B | 0 | 1 | 0 | 0 | 1 |
| | 1 | A | 0 | B | 1 | 0 | 0 | 1 |

Logic function module 10 enjoys advantages over prior multiplexer-based logic function modules which employ combinations of cascaded multiplexers, such as the ones disclosed in U.S. Pat. No. 5,005,718 to Galbraith et al., and U.S. Pat. No. 5,396,127 to Chan et al. Configuration software for programmable integrated circuits containing the logic function module of the present invention can take advantage of faster functions made possible using the logic function module of the present invention.

A significant number of real world applications for circuits including multiplexer based logic function modules can advantageously rely on the use of configurations in which only one of the two gates 30 and 32 have logic level changes at their inputs. Assume it is desired to use the first gate 30 and fix the second gate 32 to a logic level Y=1. The Y and Y! Signals will be fixed and the logic function module will be selecting between the D0 and D1 inputs. If the D0 input at node 20 is selected, there are delays through only three devices: first gate 30, MOS transistor 38 and MOS transistor 40. If the D1 input at node 20 is selected, there are also delays through only three devices: first gate 30, inverter 34, and MOS transistor 44.

Assume it is desired to use the second gate 32 and fix the first gate 30 to a logic level X=1. The X and X! Signals will be fixed and the logic function module will be selecting between the D0 and D2 inputs. If the D0 input at node 20 is selected, there are delays through only two devices: second gate 32 and MOS transistor 40. If the D2 input at node 24 is selected, there are delays through only three devices: second gate 32, inverter 36 and MOS transistor 48.

Assume it is desired to use the second gate 32 and fix the first gate 30 to a logic level X=0. The X and X! Signals will be fixed and the logic function module will be selecting between the D1 and D3 inputs. If the D1 input at node 22 is selected, there are delays though only three devices: second gate 32, MOS transistor 42, and MOS transistor 44. If the D3 input at node 26 is selected, there are delays through only three devices: second gate 32, inverter 36, and MOS transistor 52.

The advantage of the present invention is that it allows one of the first gate 30 or second gate 32 to be fixed, using the other of the two to incur no more than three propagation delays through the circuit. This is only true, however, when fixing X=0, X=1, or Y=1. When fixing Y=0 the worst-case delay is through four devices. Assume it is desired to use the first gate 30 and the D2 and D3 inputs. If the D2 input at node 24 is selected, there are delays through only three devices: first gate 30, MOS transistor 46, and MOS transistor 48. If the D3 input at node 26 is selected, there are delays through four devices: first gate 30, inverter 34, MOS transistor 50, and MOS transistor 52.

Figure 2B:
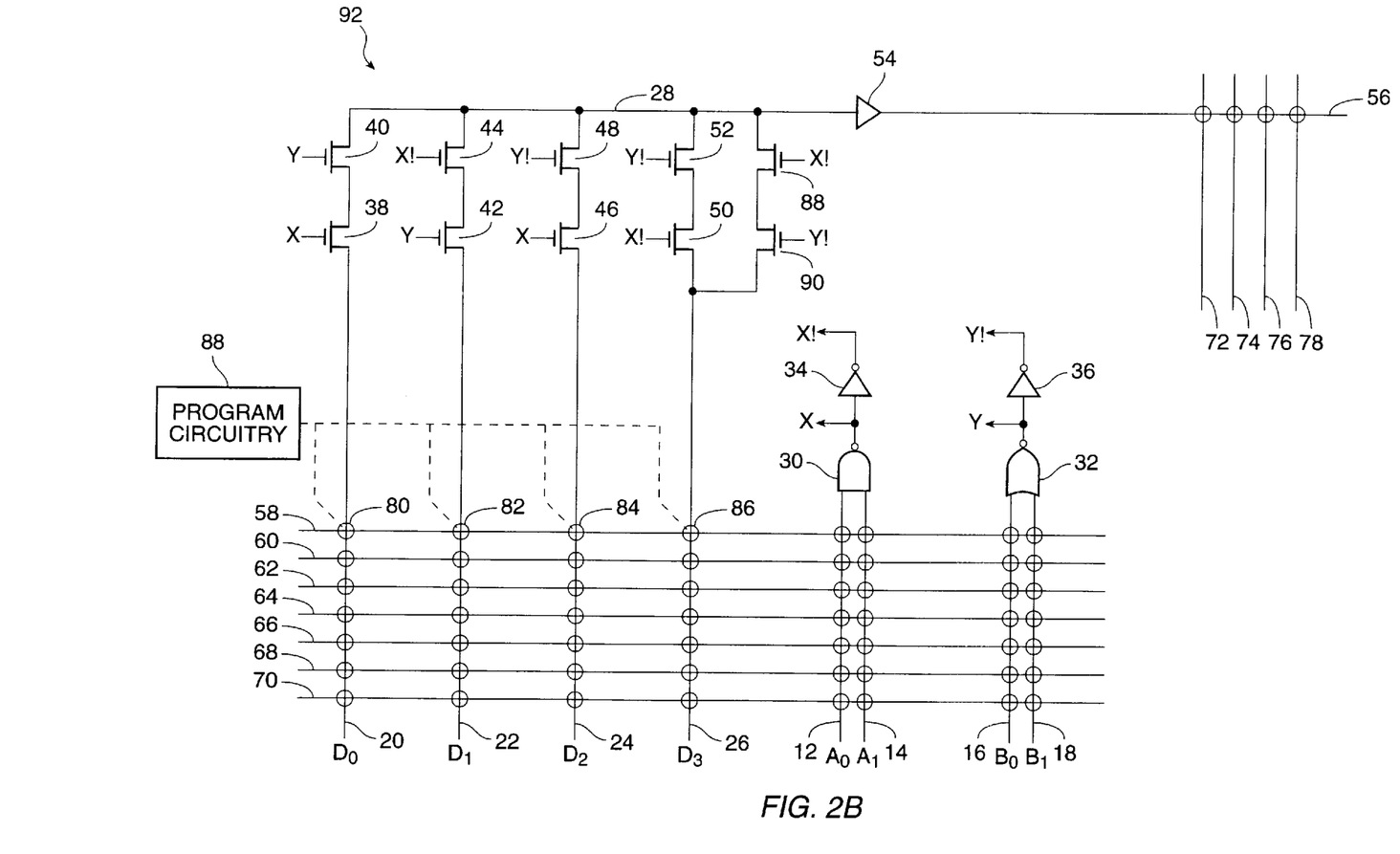
FIG. 2b is a schematic diagram of an alternate embodiment of a logic function module according to the present invention.

FIG. 2b is a schematic diagram depicting an alternate embodiment of a logic function module according to the present invention. In most respects, the logic function module of FIG. 2b is identical to that of FIG. 2a. Like elements in the two figures are given the same reference numerals, and, with the exceptions noted herein, the operation of the logic function module of FIG. 2b is the same as that of FIG. 2a. FIG. 2b shows how the addition of two MOS transistors, 88 and 90, allows fixing either the output of first gate 30 or second gate 32 to a 0 or to a 1, and in all cases incur no more than 3 delays through the circuit.

The channels of MOS transistors 88 and 90 are connected in series. The gate of transistor 90 is connected to the output of second inverter 36, and the gate of transistor 88 is connected to the output of first inverter 34. MOS transistors 88 and 90 are connected in parallel with MOS transistors 50 and 52 between input D3 and output 28.

The delay analysis is identical to that discussed above with respect to the circuit of FIG. 2a with the exception of the case when it is desired to fix the output of second gate 32 to logic level Y=0. The Y and Y! Signals will be fixed and the logic function module will be selecting between the D2 and D3 inputs. If the D2 input at node 24 is selected, there are delays through only three devices: first gate 30, MOS transistor 46, and MOS transistor 48. If the D3 input at node 26 is selected, there are delays through three devices: first gate 30, first inverter 34, and MOS transistor 88.

The logic function module of the present invention as described with reference to FIGS. 2a and 2b is implemented using N-Channel MOS transistors; however, it will be obvious to one of ordinary skill in the art that a similar analysis and implementation can be achieved using P-Channel MOS transistors.

In contrast, the prior art configuration of two first-echelon multiplexers cascaded into a single second-echelon multiplexer represented by the arrangement shown in FIGS. 1a and 1b presents asymmetry because four delay blocks are encountered through one of the inputs in each first echelon multiplexer path. Since logic function blocks of this type usually employ a NAND to drive the multiplexer select line of one of the multiplexer echelons and a NOR gate to drive the multiplexer select line of the other one of the multiplexer echelons, the operation of the logic function module is not symmetrical in applications where it is desired to actively use only one of the gates while tying off the inputs to the other.

Figure 2C:
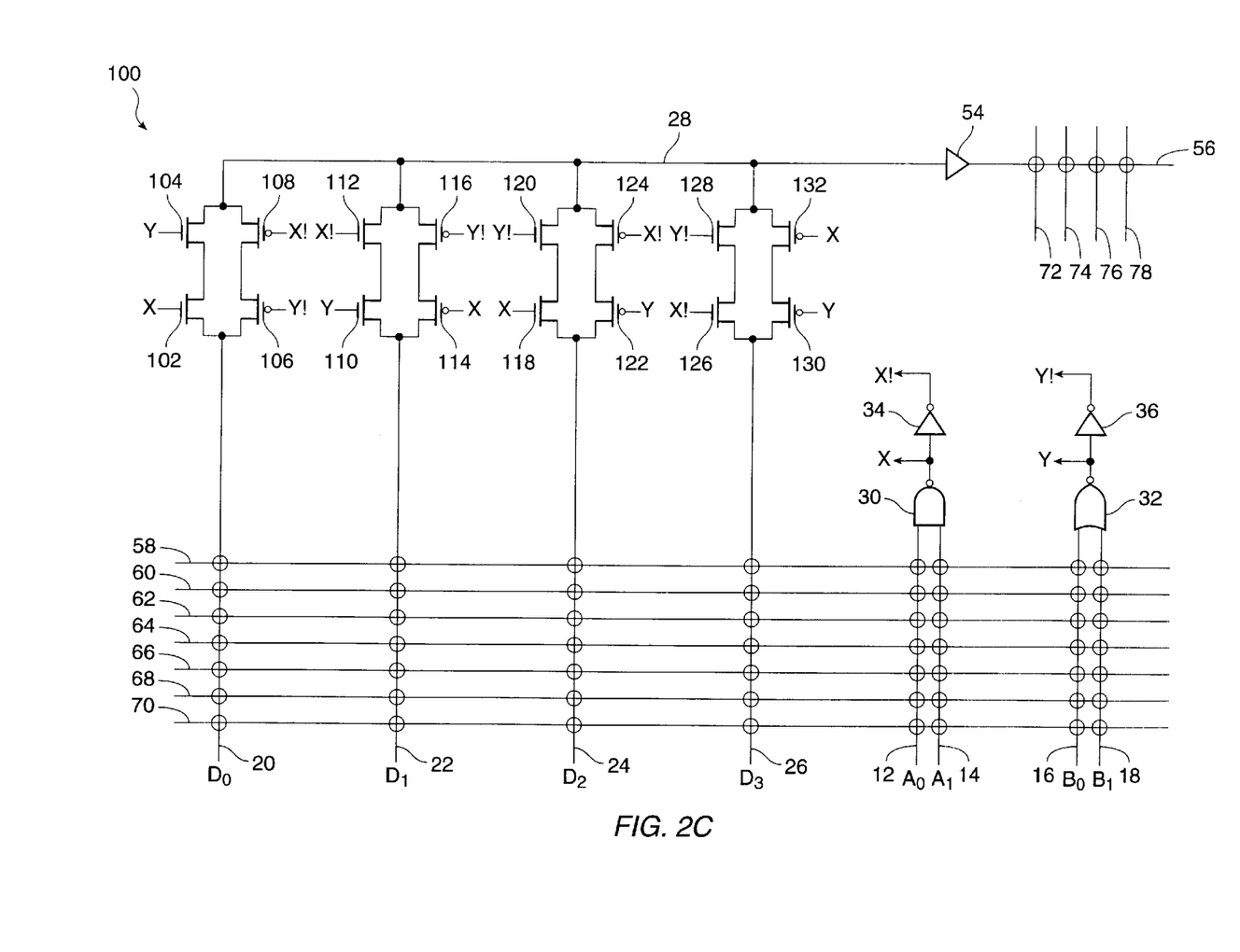

A schematic diagram of a full CMOS implementation of the logic function module of the present invention is shown in FIG. 2c. Elements of logic function module 100 which correspond to like elements of logic function module 10 of FIG. 2a will be given the same reference numerals as their counterparts in FIG. 2a.

Like logic function module 10 of FIG. 1, logic function module 100 of FIG. 2c includes input nodes 12, 14, 16, 18, 20, 22, 24, and 26, and output node 28.

Input nodes 12, 14 are used to drive the inputs of a first gate 30. First gate 30 is shown as a 2-input NAND gate, but those of ordinary skill in the art will appreciate that other gates may be employed and that more inputs may be added. Input nodes 16, and 18 are used to drive the inputs of a second gate 32. Second gate 32 is shown as a 2-input NOR gate, but, as with first gate 30, those of ordinary skill in the art will appreciate that other gates may be employed as second gate 32 and that more inputs may be added.

As in the embodiment of FIG. 2a, first and second gates 30 and 32 in the embodiment of FIG. 2c are used to generate gating signals for switching transistors employed in the logic function module of the present invention. To that end, the outputs of first and second gates 30 and 32 are inverted by first and second inverters 34 and 36, respectively, to provide inverted output signals.

As shown in FIG. 2c, the gating signal X is generated by first gate 30 and its complement X! is generated by first inverter 34 driven by first gate 30. Similarly, the gating signal Y is generated by second gate 32 and its complement Y! is generated by second inverter 36 driven by second gate 32.

The gating signals X, X!, Y, and Y! are used to control the switches connected between the input nodes 20, 22, 24, and 26 (labeled logically D0, D1, D2, and D3, respectively) and the output node 28. According to a presently preferred CMOS embodiment of the invention illustrated in FIG. 2c, the switches are CMOS switches and each comprise two pairs of N-Channel and P-Channel MOS transistors.

A first CMOS switch comprises N-Channel MOS transistor 102 and N-Channel MOS transistor 104 connected with their channels in series between input node 20 and output node 28. The gate of N-Channel MOS transistor 102 is driven by the X gating signal from the output of first gate 30. The gate of N-Channel MOS transistor 104 is driven by the Y gating signal from the output of second gate 32. Complementary P-Channel MOS transistors 106 and 108 are also connected with their channels in series between input node 20 and output node 28. The gate of P-Channel MOS transistor 106 is driven by the Y! gating signal from the output of second inverter 36. The gate of P-Channel MOS transistor 108 is driven by the X! gating signal from the output of first inverter 34.

A second CMOS switch comprises N-Channel MOS transistor 110 and N-Channel MOS transistor 112 connected with their channels in series between input node 22 and output node 28. The gate of N-Channel MOS transistor 110 is driven by the Y gating signal from the output of second gate 32. The gate of N-Channel MOS transistor 112 is driven by the X! gating signal from the output of first inverter 34. Complementary P-Channel MOS transistors 114 and 116 are also connected with their channels in series between input node 22 and output node 28. The gate of P-Channel MOS transistor 114 is driven by the X gating signal from the output of first gate 30. The gate of P-Channel MOS transistor 116 is driven by the Y! gating signal from the output of second inverter 36.

A third CMOS switch comprises N-Channel MOS transistor 118 and N-Channel MOS transistor 120 connected with their channels in series between input node 24 and output node 28. The gate of N-Channel MOS transistor 118 is driven by the X gating signal from the output of first gate 30. The gate of N-Channel MOS transistor 120 is driven by the Y! gating signal from the output of second inverter 36. Complementary P-Channel MOS transistors 122 and 124 are also connected with their channels in series between input node 24 and output node 28. The gate of P-Channel MOS transistor 122 is driven by the Y gating signal from the output of second gate 30. The gate of P-Channel MOS transistor 124 is driven by the X! gating signal from the output of first inverter 34.

A fourth CMOS switch comprises N-Channel MOS transistor 126 and N-Channel MOS transistor 128 connected with their channels in series between input node 26 and output node 28. The gate of N-Channel MOS transistor 126 is driven by the X! gating signal from the output of first inverter 34. The gate of N-Channel MOS transistor 128 is driven by the Y! gating signal from the output of inverter 36. Complementary P-Channel MOS transistors 130 and 132 are also connected with their channels in series between input node 26 and output node 28. The gate of P-Channel MOS transistor 130 is driven by the Y gating signal from the output of second gate 32. The gate of P-Channel MOS transistor 132 is driven by the X gating signal from the output of first gate 30.

Since the circuit path between input nodes 20, 22, 24, and 26 and output node 28 comprise CMOS pass transistor pairs, output node 28 does not have any inherent drive capability. Accordingly, as with the other embodiments disclosed herein, buffer amplifier 54 may be placed in the circuit between output node 28 and the output conductor 56 used to transport output signals out of logic function module 100. Buffer amplifier 54 will probably be employed in most practical circuit designs using the concepts of the present invention. While buffer amplifier 54 is depicted as a non-inverting buffer, those of ordinary skill in the art will readily recognize that an inverter or any other logic element could be employed as an output buffer as well without departing from the concepts of the present invention. As in the other embodiments disclosed herein, those of ordinary skill in the art will recognize that input buffers or gates may be provided to drive inputs D0 through D3.

As will be appreciated by those of ordinary skill in the art, like logic function module 10 of FIG. 2a, the logic function module 100 of FIG. 2c may be employed in a programmable circuit environment in which the input nodes 12, 14, 16, 18, 20, 22, 24, and 26 and the output node 28 are programmably connected to other circuit elements using one of the various known programmable interconnect technologies. Such technologies include, but are not limited to, mask-level programming, laser programming, antifuses, pass transistors, non-volatile memory elements, and the like.

The programmable connectability of the logic function module 100 of the present invention is also illustrated in FIG. 2c. A plurality of interconnect conductors 58, 60, 62, 64, 66, 68, and 70 are shown intersecting the conductors which comprise input nodes 12, 14, 16, 18, 20, 22, 24, and 26. In addition, interconnect conductors 72, 74, 76, and 78 are shown intersecting output conductor 56 of logic function module 10.

Performing the same delay analysis as performed above for the embodiment of FIG. 2a, it can be shown that the output of either gate 30 or gate 32 can be fixed to a 0 or to a 1, and no more than three delays are incurred from input 20, 22, 24, or 26 to output 28. Assume that the output of gate 32 is fixed to a logic level Y=0. The Y and Y! Signals will be fixed and the logic function module will be selecting between the D2 and D3 inputs. If the D2 input at node 24 is selected, there are delays through only three devices: gate 30, N-Channel MOS transistor 118 and N-Channel MOS transistor 120. The path through the P-Channel MOS devices is also three delays through gate 30, inverter 34, and P-Channel MOS transistor 124. If the D3 input at node 26 is selected, there are delays through only two devices: gate 30, and P-Channel MOS transistor 132. The path through the N-Channel MOS devices encounters four delays through gate 30, inverter 34, N-Channel MOS transistor 126, and N-Channel MOS transistor 128. The faster path in this case will win, so there are actually only two device delays. It is also important to note that the N-Channel MOS path that requires four delays to turn on so that data can pass from D3 to the output only requires three delays to turn off through gate 30, inverter 34, and transistor 126. As a result switching between X=0 and X=1 only incurs a maximum of three delays to either turn on or turn off any given data path.

Assume that the output of gate 32 is fixed to a logic level Y=1. The Y and Y! Signals will be fixed and the logic function module will be selecting between the D0 and D1 inputs. If the D0 input at node 20 is selected, there are delays through only three devices: gate 30, N-Channel MOS transistor 102, and N-Channel MOS transistor 104. The path through the P-Channel MOS devices is also three delays through gate 30, inverter 34, and MOS transistor 108. If the D1 input at node 22 is selected, there are delays through three devices: gate 30, inverter 34, and N-Channel MOS transistor 112. The path through the P-Channel MOS devices also encounters three delays through gate 30, P-Channel MOS transistor 114, and P-Channel MOS transistor 116.

Assume that the output of gate 30 is fixed to a logic level X=0. The X and X! Signals will be fixed and the logic function module will be selecting between the D1 and D3 inputs. If the D1 input at node 22 is selected, there are delays through only three devices: gate 32, N-Channel MOS transistor 110, and N-Channel MOS transistor 112. The path through the P-Channel MOS devices is also three delays through gate 32, inverter 36, and P-Channel MOS transistor 116. If the D3 input at node 26 is selected, there are delays through three devices: gate 32, inverter 36, and N-Channel MOS transistor 128. The path through the P-Channel MOS devices also encounters three delays through gate 32, P-Channel MOS transistor 130, and P-Channel MOS transistor 132.

Assume that the output of gate 30 is fixed to a logic level X=1. The X and X! Signals will be fixed and the logic function module will be selecting between the D0 and D2 inputs. If the D0 input at node 20 is selected, there are delays through only two devices: gate 32, and N-Channel MOS transistor 104. The path through the P-Channel MOS devices is four delays through gate 32, inverter 36, P-Channel MOS transistor 106 and P-Channel MOS transistor 108, but the faster path through the N-Channel MOS devices will win. If the D2 input at node 24 is selected, there are delays through three devices: gate 32, inverter 36, and N-Channel MOS transistor 120. The path through the P-Channel MOS devices also encounters three delays through gate 32, MOS transistor 122, and P-Channel MOS transistor 124. It is also important to note that the P-Channel MOS transistor path that requires four delays to turn on so that data can pass from D0 to the output only requires three delays to turn off through gate 32, inverter 36, and P-Channel MOS transistor 106. As a result switching between Y=0 and Y=1 only incurs a maximum of three delays to either turn on or turn off any given data path.

The logic function module of the present invention depicted in FIGS. 2a through 2c can include other elements without departing from the spirit of the invention as disclosed herein. For example, referring now to FIG. 3, a block diagram is presented of another logic function module 92 according to the present invention. The logic module depicted in FIG. 3 includes logic function module 10 of FIG. 2a and also includes elements in addition to those shown therein.

Figure 3:
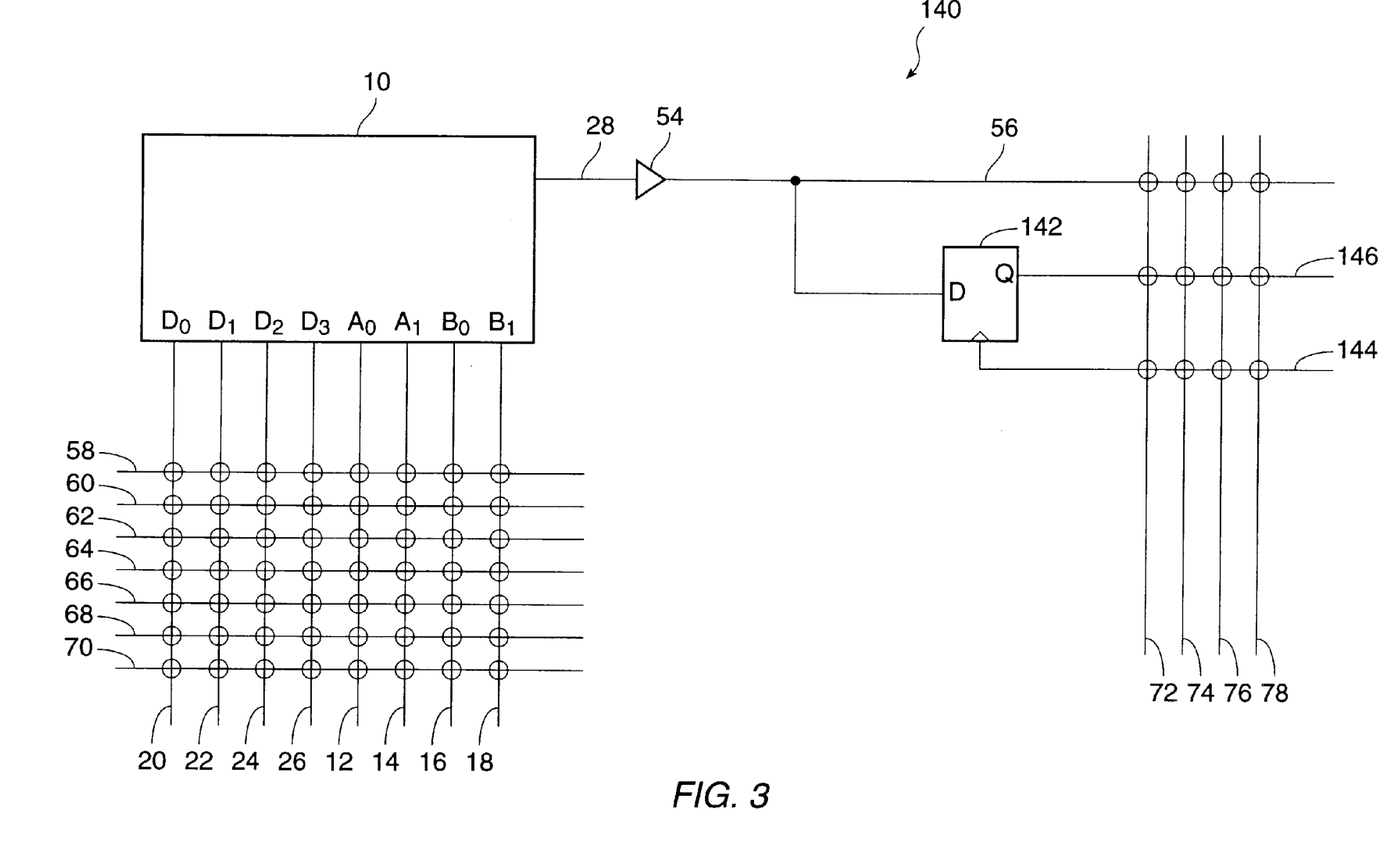
FIG. 3 is a block diagram illustrating a logic function module according to the present invention including the module of FIG. 2a and other elements which extend its functionality.

The logic function module 10 of either of FIGS. 2a and 2b may be included in logic function block 140 in an advantageous combination with a sequential element 142 to give the logic function module depicted in FIG. 3 greater functionality. The logic function module 10 of FIG. 2a is shown in block diagram form to avoid overcomplicating the drawing figure. The input and output connections of the logic function module 10 of FIG. 2a and other elements which are also present in the logic function module 140 of FIG. 3 are given the same reference numerals in the embodiment shown in FIG. 3.

Thus, buffer amplifier 54 may be placed in the circuit between output node 28 and an output conductor 56 used to transport output signals out of logic function module 140. In addition, the input nodes 12, 14, 16, 18, 20, 22, 24, and 26 and the output node 28 are programmably connected to other circuit elements using one of the aforementioned known programmable interconnect technologies.

A plurality of interconnect conductors 58, 60, 62, 64, 66, 68, and 70 are shown intersecting the conductors which comprise input nodes 12, 14, 16, 18, 20, 22, 24, and 26. In addition, interconnect conductors 72, 74, 76, and 78 are shown intersecting output conductor 56 of logic function module 140 of FIG. 3.

As in the embodiment of logic function module 10 of FIGS. 2a and 2b, programmable interconnect elements are employed to selectively make connections between the inputs and outputs of the logic function module 92 of FIG. 2c and the inputs and outputs of other logic function modules, other circuitry on the integrated circuit incorporating the present invention, and I/O structures associated therewith.

Sequential element 142 may comprise a flip-flop such as a D flip-flop as illustrated in FIG. 3. Those of ordinary skill in the art will recognize that other types of flip-flops and sequential elements may be employed in the present invention as sequential element 142. The D input of flip-flop 142 is shown in FIG. 3 as permanently connected to the output conductor 56 of the logic function module 10, but persons of ordinary skill in the art will recognize that this connection may be made programmable. The clock input line 144 and the output line 146 of sequential element 142 form intersections with interconnect conductors just as does output conductor 56 of logic function module 10. Programmable interconnect elements are utilized to make connections between clock input line 144 and the output line 146 of sequential element 142 and other circuit elements on the integrated circuit containing logic function module 140.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A logic function module comprising:

first through eighth input nodes;

an output node;

a first logic gate having a first input driven from said first input node, a second input driven from said second input node, and an output;

a first inverter having an input driven from the output of said first logic gate and an output;

a second logic gate having a first input driven from said third input node, a second input driven from said fourth input node, and an output;

a second inverter having an input driven from the output of said second logic gate and an output;

first and second MOS transistors connected in series between said fifth input node and said output node, said first MOS transistor having a gate driven from the output of said first logic gate and said second MOS transistor having a gate driven from the output of said second logic gate;

third and fourth MOS transistors connected in series between said sixth input node and said output node, said third MOS transistor having a gate driven from the output of said second logic gate and said fourth MOS transistor having a gate driven from the output of said first inverter;

fifth and sixth MOS transistors connected in series between said seventh input node and said output node, said fifth MOS transistor having a gate driven from the output of said second inverter and said sixth MOS transistor having a gate driven from the output of said first logic gate; and seventh and eighth MOS transistors connected in series between said eighth input node and said output node, said seventh MOS transistor having a gate driven from the output of said first inverter and said eighth MOS transistor having a gate driven from the output of said second inverter.

2. The logic function module of claim 1 wherein said first logic gate is a NAND gate and said second logic gate is a NOR gate.

3. The logic function module of claim 1 wherein said first through eighth MOS transistors are N-Channel MOS transistors.

4. The logic function module of claim 1 further including:

an interconnect architecture comprising a plurality of interconnect conductors, ones of said interconnect conductors intersecting with said first through eighth input nodes and said output node;

programmable interconnect elements disposed between at least some of said intersecting interconnect conductors and said first through eighth input nodes and said output node, said programmable interconnect elements having a first substantially non-conductive state and a second low-impedance conductive state; and programming circuitry communicating with said programmable interconnect conductors for configuring selected ones of said programmable interconnect elements to assume said low-impedance conductive state.

5. A logic function module comprising:

a switching circuit including four data inputs and an output, and control circuitry comprising at least two logic gates driving said switching circuit, said logic gates each having at least one input;

said switching circuit and said control circuitry characterized in that data delays between a pair of said data inputs and said output are symmetrical when each at least one output of one of said logic gates is held fixed; and wherein said switching circuit includes a first pair of switches connected between one of said data inputs and said output, a second pair of switches connected between one of said data inputs and said output, a third pair of switches connected between one of said data inputs and said output, and a fourth pair of switches connected between one of said data inputs and said output.

6. The logic function module of claim 5, wherein:

said control circuitry further includes a first inverter and a second inverter, said first inverter for receiving the output of one of said at least two logic gates and said second inverter for receiving the output of the other one of said at least two logic gates;

said switching circuit includes a first pair of switches and a second pair of switches, said first pair of switches connected in series between one of said four data inputs and said output, and said second pair of switches connected in series between one of said four data inputs and said output so as to create a parallel circuit with said first pair of switches; and wherein said first and second pair of switches are controlled from an output of said first inverter and an output of said second inverter.

7. A logic function module comprising:

first through eighth input nodes;

an output node;

a first logic gate having a first input driven from said first input node, a second input driven from said second input node, and an output;

a first inverter having an input driven from the output of said first logic gate and an output;

a second logic gate having a first input driven from said third input node, a second input driven from said fourth input node, and an output;

a second inverter having an input driven from the output of said second logic gate and an output;

first and second MOS transistors connected in series between said fifth input node and said output node, said first MOS transistor having a gate driven from the output of said first logic gate and said second MOS transistor having a gate driven from the output of said second logic gate;

third and fourth MOS transistors connected in series between said sixth input node and said output node, said third MOS transistor having a gate driven from the output of said second logic gate and said fourth MOS transistor having a gate driven from the output of said first inverter;

fifth and sixth MOS transistors connected in series between said seventh input node and said output node, said fifth MOS transistor having a gate driven from the output of said second inverter and said sixth MOS transistor having a gate driven from the output of said first logic gate;

seventh and eighth MOS transistors connected in series between said eighth input node and said output node, said seventh MOS transistor having a gate driven from the output of said first inverter and said eighth MOS transistor having a gate driven from the output of said second inverter; and a sequential logic element having an input connected to said output node and an output connected to a sequential element output node.

8. The logic function module of claim 7 wherein said first logic gate is a NAND gate and said second logic gate is a NOR gate.

9. The logic function module of claim 7 wherein said first through eighth MOS transistors are N-Channel MOS transistors.

10. The logic function module of claim 7 further including:

an interconnect architecture comprising a plurality of interconnect conductors, ones of said interconnect conductors intersecting with said first through eighth input nodes and said output node;

programmable interconnect elements disposed between at least some of said intersecting interconnect conductors and said first through eighth input nodes and said output node, said programmable interconnect elements having a first substantially non-conductive state and a second low-impedance conductive state; and programming circuitry communicating with said programmable interconnect conductors for configuring selected ones of said programmable interconnect elements to assume said low-impedance conductive state.

11. A logic function module comprising:

a plurality of input nodes;

an output node;

a first control circuit having at least one input connected to one of said input nodes, a first output, and a second output which is the complement of said first output;

a second control circuit having at least one input connected to one of said input nodes, a first output, and a second output which is the complement of said first output;

a first switching circuit connected between one of said input nodes and said output node, said first switching circuit controlled from said first output of said first control circuit said first output of said second switching circuit;

a second switching circuit connected between one of said input nodes and said output node, said second switching circuit controlled from said second output of said first control circuit said first output of said second switching circuit;

a third switching circuit connected between one of said input nodes and said output node, said third switching circuit controlled from said first output of said first control circuit said second output of said second switching circuit; and a fourth switching circuit including a first pair of switches and a second pair of switches, said first pair of switches connected in series between one of said input nodes and said output nodes, said second pair of switches connected in series between one of said input nodes and said output nodes so as to create a parallel circuit with said first pair of switches, said first and second pair of switches is controlled from said second output of said first control circuit and said second output of said second output of said second control circuit.

12. The logic function module of claim 11 wherein said first control circuit is a NAND gate and said second control circuit is a NOR gate.

13. The logic function module of claim 11 further including:
- an interconnect architecture comprising a plurality of interconnect conductors, ones of said interconnect conductors intersecting with said plurality of input nodes and said output node;
- programmable interconnect elements disposed between at least some of said intersecting interconnect conductors and said plurality of input nodes and said output node, said programmable interconnect elements having a first substantially non-conductive state and a second low-impedance conductive state; and
- programming circuitry communicating with said programmable interconnect conductors for configuring selected ones of said programmable interconnect elements to assume said low-impedance conductive state.

14. The logic function module of claim 11 wherein said first through fourth switching circuits are CMOS switches.

15. The logic function module of claim 11, wherein said pair of switches include a first MOS transistor and a second MOS transistor which have their channels connected in series.

16. The logic function module of claim 15, wherein a gate of said first MOS transistor from said first pair of switches and a gate of said first MOS transistor from said second pair of switches are connected to the second outputs of said first and second control switches, respectively.

17. The logic function module of claim 15, wherein a gate of said second MOS transistor from said first pair of switches and a gate of said second MOS transistor from said second pair of switches are connected to the second outputs of said first and second control switches, respectively.

* * * * *